United States Patent
Wang

(10) Patent No.: US 8,335,322 B2
(45) Date of Patent: Dec. 18, 2012

(54) MUTE CONTROL CIRCUIT AND ELECTRONIC DEVICE USING SAME

(75) Inventor: Tao Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 315 days.

(21) Appl. No.: 12/868,183

(22) Filed: Aug. 25, 2010

(65) Prior Publication Data

US 2012/0014536 A1 Jan. 19, 2012

(30) Foreign Application Priority Data

Jul. 15, 2010 (CN) .......................... 2010 1 0225979

(51) Int. Cl.
*H04B 15/00* (2006.01)
(52) U.S. Cl. ........... 381/94.5; 381/28; 381/120; 330/51; 330/251
(58) Field of Classification Search .................... 381/28, 381/120, 94.5; 330/51, 251
See application file for complete search history.

(56) References Cited

U.S. PATENT DOCUMENTS

| | | | |
|---|---|---|---|
| 8,199,930 B2 * | 6/2012 | Wu | 381/94.5 |
| 2006/0023896 A1 | 2/2006 | Ginsberg et al. | |
| 2008/0137882 A1 * | 6/2008 | Tsai et al. | 381/94.5 |

* cited by examiner

*Primary Examiner* — Disler Paul
(74) *Attorney, Agent, or Firm* — Altis Law Group, Inc.

(57) ABSTRACT

An electronic device includes an amplifier, an output unit, a processing unit, and a mute control circuit. The amplifier is for amplifying audio signals and generating amplified audio signals accordingly. The amplifier includes an output port to output the amplified audio signals. The output unit is for emitting sounds corresponding to the amplified audio signals. The processing unit is for generating a mute control signal. The mute control circuit includes a main circuit and an auxiliary circuit. The main circuit is for responding to the mute control signal, and for driving the amplifier to change between a mute state and a play state accordingly. The auxiliary circuit is for enabling the output port of the amplifier to be electrically grounded at the moment of supplying power to the electronic device.

16 Claims, 2 Drawing Sheets

MUTE CONTROL CIRCUIT AND ELECTRONIC DEVICE USING SAME

BACKGROUND

1. Technical Field

The present disclosure relates to electronic devices, and particularly to an electronic device with a mute control circuit.

2. Description of Related Art

An electronic device, such as a DVD player, usually includes an amplifier for amplifying audio signals, a processing unit for controlling the amplifier, and a speaker for emitting sounds corresponding to the amplified audio signals.

However, at the moment of supplying power to the electronic device, a stable working voltage of the processing unit is not instantaneous and the amplifier is out of control during the delay. As such, at the moment of supplying power to the electronic device, a direct current may appear on the amplifier and then be transmitted to the speaker in the form of noise which is an inconvenience.

Therefore, there is room for improvement in the art.

BRIEF DESCRIPTION OF THE DRAWINGS

The components of the drawings are not necessarily drawn to scale, the emphasis instead being placed upon clearly illustrating the principles of the embodiment of an electronic device with a mute control circuit. Moreover, in the drawings, like reference numerals designate corresponding parts throughout the views.

DETAILED DESCRIPTION

Embodiments of the present disclosure will now be described in detail with reference to the drawings.

Figure 1:
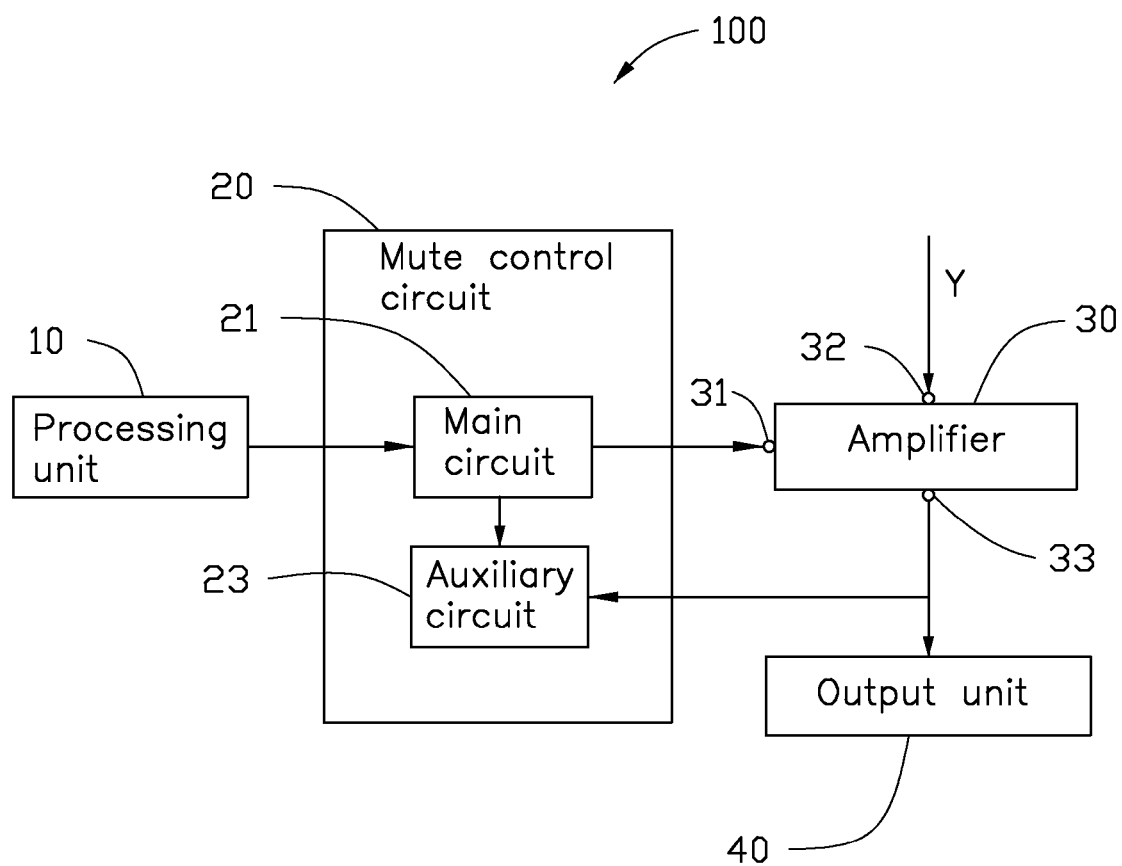
FIG. 1 is a functional block diagram of an electronic device according to an exemplary embodiment. The electronic device includes a mute control circuit.

Referring to FIG. 1, an electronic device 100 according to an exemplary embodiment is illustrated. In this embodiment, the electronic device 100 is a DVD player. The electronic device 100 includes a processing unit 10, a mute control circuit 20, an amplifier 30, and an output unit 40.

The processing unit 10 is used for generating a mute control signal. The mute control signal can be a high level signal, or a low level signal.

The mute control circuit 20 is electrically connected to the processing unit 10, the amplifier 30, and the output unit 40. The mute control circuit 20 is used for responding to the mute control signal to drive the amplifier 30 to change between a mute state and a play state accordingly. When the mute control signal is a high level signal, the mute control circuit 20 drives the amplifier 30 to be in the play state. When the mute control signal is a low level signal, the mute control circuit 20 drives the amplifier 30 to be in the mute state. The mute control circuit 20 further drives the amplifier 30 to stop the output signals to the output unit 40 at the moment of supplying power to the electronic device 100.

The mute control circuit 20 includes a main circuit 21 and an auxiliary circuit 23. The main circuit 21 is electrically connected between the processing unit 10 and the amplifier 30, and is used for driving the amplifier 30 to change between the mute state and the play state in response to the mute control signal. When the main circuit 21 receives the high level signal from the processing unit 10, the main circuit 21 generates a first driver signal to the amplifier 30, and the amplifier 30 is in the play state accordingly. When the main circuit 21 receives the low signal from the processing unit 10, the main circuit 21 generates a second driver signal to the amplifier 30, and the amplifier 30 is in the mute state accordingly.

The auxiliary circuit 23 is used for enabling the amplifier 30 to stop the output signals to the output unit 40 at the moment of supplying power to the electronic device 100. One end of the auxiliary circuit 23 is electrically connected to the main circuit 21, and the other end of the auxiliary circuit 23 is electrically connected between the amplifier 30 and the output unit 40.

The amplifier 30 is used for amplifying audio signals Y from other members (not shown) of the electronic device 100, and generating amplified audio signals accordingly. The amplifier 30 is enabled and disabled by the mute control circuit 20 in response to the mute control signal from the processing unit 10. Thus, the amplifier 30 is under control of the processing unit 10. In this embodiment, the amplifier 30 is an audio-amplifier IC. The amplifier 30 includes a first input port 31, a second input port 32, and an output port 33.

The first input port 31 is electrically connected to the main circuit 21 for receiving the first driver signal and the second driver signal. The second input port 32 is electrically connected to other members for receiving the audio signals Y. The output port 33 is electrically connected to the output unit 40 to output the amplified audio signals, and the output port 33 is further electrically connected to the auxiliary circuit 23. At the moment of supplying power to the electronic device 100, the auxiliary circuit 23 drives the output port 33 of the amplifier 30 to be electrically grounded.

The output unit 40 is used for receiving the amplified audio signals and emitting sounds corresponding to the amplified audio signals. The output unit 40 may be a built-in speaker of the electronic device 100, or a peripheral speaker of the electronic device 100.

Thus, when the amplifier 30 is in the play state according to the first driver signal, the amplifier 30 outputs the amplified audio signals to the output unit 40. When the amplifier 30 is in the mute state according to the second driver signal, the amplifier 30 stops the output of the amplified audio signals to the output unit 40. When the electronic device 100 is supplied power, the auxiliary circuit 23 drives the output port 33 of the amplifier 30 to be electrically grounded for a moment.

Figure 2:
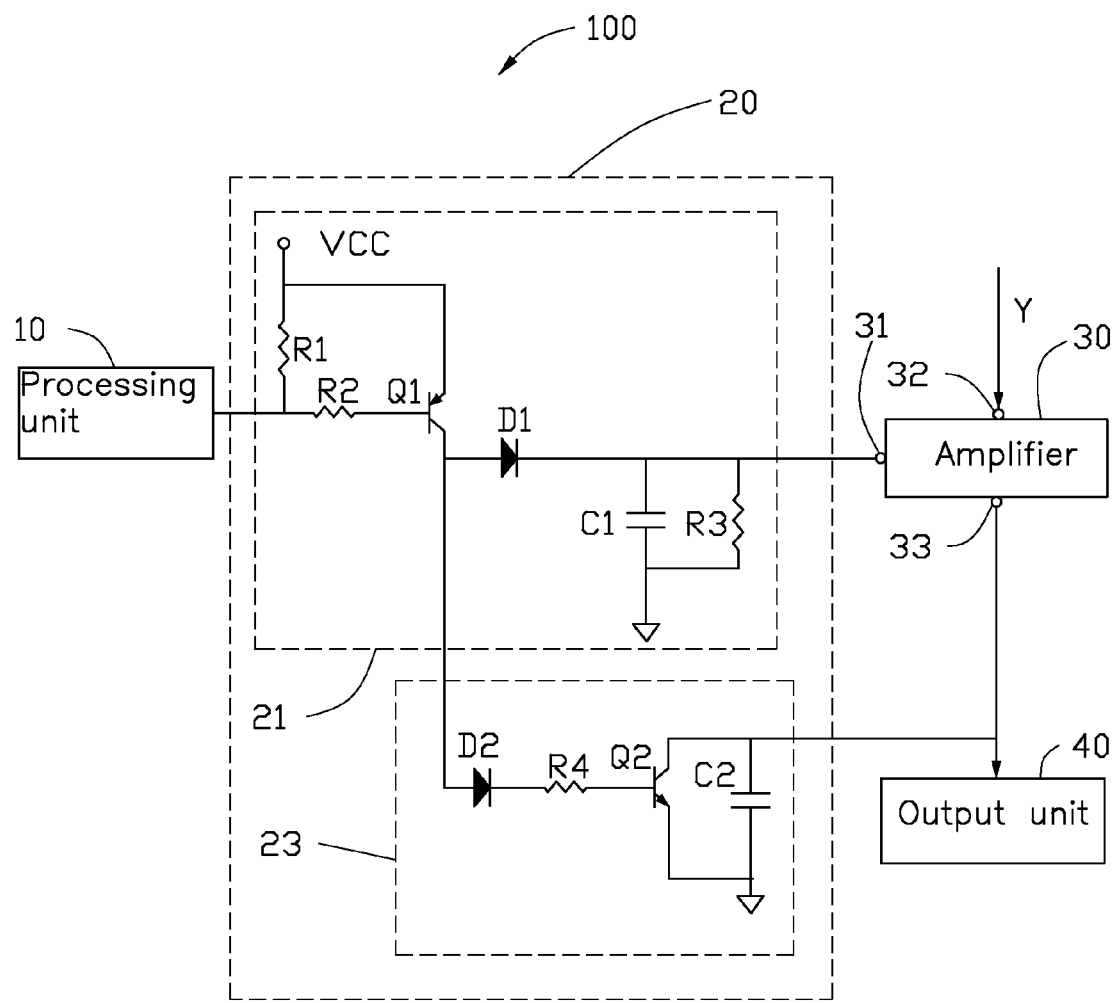
FIG. 2 is a detailed circuit diagram of the mute control circuit of FIG. 1.

Referring to FIG. 2, the main circuit 21 includes a power source Vcc, a first resistor R1, a second resistor R2, a third resistor R3, a first transistor Q1, a first diode D1, and a first capacitor C1. One end of the first resistor R1 is electrically connected to the processing unit 10, the other end of the first resistor R1 is electrically connected to the power source Vcc. One end of the second resistor R2 is electrically connected to the processing unit 10, the other end of the second resistor R2 is electrically connected to a base of the first transistor Q1. An emitter of the first transistor Q1 is electrically connected to the power source Vcc. A collector of the first transistor Q1 is electrically connected to the input port 31 of the amplifier 30 through the first diode D1. An anode of the first diode D1 is electrically connected to the collector of the first transistor Q1. A cathode of the first diode D1 is electrically connected to the input port 31. One end of the capacitor C1 is electrically grounded, the other end of the capacitor C1 is electrically connected to the input port 31. One end of the third resistor R3 is electrically grounded, the other end of the third resistor R3 is electrically connected to the input port 31.

The auxiliary circuit 23 includes a second diode D2, a fourth resistor R4, a second transistor Q2, and a second capacitor C2. An anode of the second diode D2 is electrically connected to the collector of the first transistor Q1. A cathode of the second diode D2 is electrically connected to a base of the second transistor Q2 through the fourth resistor R4. A collector of the second transistor Q2 is electrically connected to the output port 33 of the amplifier 30. An emitter of the second transistor Q2 is electrically grounded. One end of the second capacitor C2 is electrically connected to the collector the second transistor Q2, the other end of the second capacitor C2 is electrically grounded.

In this embodiment, the first resistor R1 is for pulling up the emitter of the first transistor Q1 to sustain a high level signal state. The third resistor R3 is for pulling down the input port 31 to sustain a low level signal state. The second resistor R3 and the fourth resistor R4 are for controlling current. The first capacitor C1 and the second capacitor C2 are for filtering. The first transistor Q1 is a PNP type bipolar junction transistor. The second transistor Q2 is a NPN type bipolar junction transistor. The first diode D1 and the second diode D2 allow an alternating current (AC) voltage to pass through and block a direct current (DC) voltage.

At the moment of supplying power to the electronic device 100, the second capacitor C2 of the auxiliary circuit 23 is charged, and the output port 33 of the amplifier 30 is electrically grounded through the second capacitor C2. Thus, the output unit 40 cannot receive the amplified audio signals at the moment of supplying power to the electronic device 100, and the output unit 40 will not generate sounds accordingly.

When the processing unit 10 generates a high level signal, the first transistor Q1 is turned off. The input port 31 is electrically grounded through the third resistor R3, and the input port 31 receives a low level signal accordingly. The amplifier 30 is in the play state according to the low level signal. As the first transistor Q1 is turned off, the second transistor Q2 is turned off. The amplifier 30 outputs the amplified audio signals to the output unit 40 through the output port 33.

When the processing unit 10 generates a low level signal, the first transistor Q1 is turned on. The input port 31 is electrically connected to the power source Vcc through the first transistor Q1, and the input port 31 receives a high level signal accordingly. The amplifier 30 is in the mute state according to the high level signal. As the first transistor Q1 is turned on, the second transistor Q2 is turned on. The output port 33 is electrically grounded through the second transistor Q2. The amplifier 30 stops the output of the amplified audio signals to the output unit 40 through the output port 33.

If the mute control circuit 20 does not include the second diode D2, as a PN junction characteristic of a transistor, the second transistor Q2 will has a reverse leakage current from the collector to the base, and finally to the ground through the fourth resistor R4, a first diode D1, and the third resistor R3. The output of the amplifier 30 is divided into two parts. One part of the output of the amplifier 30 is sent into the output unit 40, the other part of the output of the amplifier 30 is sent into ground by the second transistor Q2. However, as the mute control circuit 20 includes the second diode D2, the second diode D2 is turned off when the first transistor Q1 is turned off. The output of the amplifier 30 is completely sent into the output unit 40, and can not be distorted by the auxiliary circuit 23.

If the mute control circuit 20 does not include the first diode D1, the electronic device 100 experiences a delay from the mute state to the play state. In detail, when the electronic device 100 is in the mute state, the first capacitor C1 stores power. When the electronic device 100 is changed from the mute state to the play state, the first transistor Q1 is turned off, and the first capacitor C1 activates as a power source to provide power for the second diode D2 and the second transistor Q2. The second diode D2 and the second transistor Q2 are turned on to enable the output port 33 to be electrically grounded. Thus, the amplifier 30 will be in the mute state for the delay determined by the first capacitor C1. However, as the mute control circuit 20 includes the first diode D1, the first diode D1 is turned off when the first transistor Q1 is turned off. Thus, the second diode D2 and the second transistor Q2 will not be turned on.

As discussed above, the amplifier 30 can be in the mute state at the moment of supplying power to the electronic device 100, and the output unit 40 will not generate sounds accordingly. When the amplifier 30 is in the play state, the output of the amplifier 30 will not be distorted and can be completely sent into the output unit 40. When the amplifier 30 is changed from the mute state to the play state, no delay exist. Thus, the electronic device 100 has acceptable amplified audio signals.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation to encompass all such modifications and similar arrangements.

What is claimed is:

1. An electronic device, comprising:
an amplifier for amplifying audio signals and generating amplified audio signals accordingly, the amplifier comprising an output port for outputting the amplified audio signals;
an output unit for emitting sounds corresponding to the amplified audio signals;
a processing unit for generating a mute control signal; and
a mute control circuit comprising:
a main circuit for responding to the mute control signal, and driving the amplifier to change between a mute state and a play state accordingly; and
an auxiliary circuit for enabling the output port of the amplifier to be electrically grounded at the moment of supplying power to the electronic device;
wherein the amplifier further comprises an input port electrically connected to the processing unit through the main circuit, one end of the auxiliary circuit is electrically connected to the main circuit, the other end of the auxiliary circuit is electrically connected to the output port, the main circuit comprises:
a power source;
a first resistor, one end of the first resistor electrically connected to the processing unit, the other end of the first resistor electrically connected to the power source;
a second resistor;
a first transistor, a base of the first transistor electrically connected to the processing unit through the second resistor, an emitter of the first transistor electrically connected to the power source, a collector of the first transistor electrically connected to the input port of the amplifier; and
a third resistor, one end of the third resistor electrically grounded, the other end of the third resistor electrically connected to the input port.

2. The electronic device of claim 1, wherein the main circuit comprises a first capacitor, one end of the capacitor is electrically grounded, the other end of the capacitor is electrically connected to the input port.

3. The electronic device of claim 2, wherein the main circuit further comprises a first diode, an anode of the first diode is electrically connected to the collector of the first transistor, a cathode of the first diode is electrically connected to the input port.

4. The electronic device of claim 3, wherein the auxiliary circuit comprises:
a fourth resistor;
a second transistor, a base of the second transistor electrically connected to the collector of the first transistor through the fourth resistor, a collector of the second transistor electrically connected to the output port of the amplifier, an emitter of the second transistor electrically grounded; and
a second capacitor, one end of the second capacitor electrically connected to the output port, the other end of the second capacitor electrically grounded.

5. The electronic device of claim 4, wherein the auxiliary circuit further comprises a second diode, an anode of the second diode is electrically connected to the collector of the first transistor, a cathode of the second diode is electrically connected to the base of the second transistor through the fourth resistor.

6. The electronic device of claim 4, wherein the first transistor is a PNP type bipolar junction transistor, the second transistor is a NPN type bipolar junction transistor.

7. An electronic device, comprising:
an amplifier, comprising an input port and an output port;
an output unit electrically connected to the output port;
a processing unit electrically connected to the input port, the processing unit configured for generating a mute control signal; and
a mute control circuit comprising:
a main circuit, one end of the main circuit electrically connected to the processing unit, the other end of the main circuit electrically connected to the input port, the main circuit configured for driving the amplifier to change between a mute state and a play state in response to the mute control signal; and
an auxiliary circuit, one end of the auxiliary circuit electrically connected to the main circuit, the other end of the auxiliary circuit electrically connected to the output port, the auxiliary circuit configured for driving the output port of the amplifier to be electrically grounded at the moment of supplying power to the electronic device
wherein the main circuit comprises:
a power source;
a first resistor, one end of the first resistor electrically connected to the processing unit, the other end of the first resistor electrically connected to the power source;
a second resistor;
a first transistor, a base of the first transistor electrically connected to the processing unit through the second resistor, an emitter of the first transistor electrically connected to the power source, a collector of the first transistor electrically connected to the input port of the amplifier;
a first capacitor, one end of the capacitor is electrically grounded, the other end of the capacitor is electrically connected to the input port; and
a third resistor, one end of the third resistor electrically grounded, the other end of the third resistor electrically connected to the input port.

8. The electronic device of claim 7, wherein the main circuit further comprises a first diode, an anode of the first diode is electrically connected to the collector of the first transistor, a cathode of the first diode is electrically connected to the input port.

9. The electronic device of claim 8, wherein the auxiliary circuit comprises:
a fourth resistor;
a second transistor, a base of the second transistor electrically connected to the collector of the first transistor through the fourth resistor, a collector of the second transistor electrically connected to the output port of the amplifier, an emitter of the second transistor electrically grounded; and
a second capacitor, one end of the second capacitor electrically connected to the output port, the other end of the second capacitor electrically grounded.

10. The electronic device of claim 9, wherein the auxiliary circuit further comprises a second diode, an anode of the second diode is electrically connected to the collector of the first transistor, a cathode of the second diode is electrically connected to the base of the second transistor through the fourth resistor.

11. A mute control circuit used for an electronic device, the mute control circuit comprising:
a main circuit configured for responding to a mute control signal from a processing unit of the electronic device, and electrically connecting to an input port of an amplifier of the electronic device for driving the amplifier to change between a mute state and a play state accordingly; and
an auxiliary circuit configured for enabling an output port of the amplifier to be electrically grounded at the moment of supplying power to the electronic device, the output port configured for outputting audio signals amplified by the amplifier to an output unit of the electronic device, the output unit configured for emitting sounds corresponding to the amplified audio signals;
wherein the main circuit comprises:
a power source;
a first resistor, one end of the first resistor electrically connected to the processing unit, the other end of the first resistor electrically connected to the power source;
a second resistor;
a first transistor, a base of the first transistor electrically connected to the processing unit through the second resistor, an emitter of the first transistor electrically connected to the power source, a collector of the first transistor electrically connected to the input port of the amplifier; and
a third resistor, one end of the third resistor electrically grounded, the other end of the third resistor electrically connected to the input port.

12. The mute control circuit of claim 11, wherein the main circuit comprises a first capacitor, one end of the capacitor is electrically grounded, the other end of the capacitor is electrically connected to the input port.

13. The mute control circuit of claim 12, wherein the main circuit further comprises a first diode, an anode of the first diode is electrically connected to the collector of the first transistor, a cathode of the first diode is electrically connected to the input port.

14. The mute control circuit of claim 13, wherein the auxiliary circuit comprises:
   a fourth resistor;
   a second transistor, a base of the second transistor electrically connected to the collector of the first transistor through the fourth resistor, a collector of the second transistor electrically connected to the output port of the amplifier, an emitter of the second transistor electrically grounded; and
   a second capacitor, one end of the second capacitor electrically connected to the output port, the other end of the second capacitor electrically grounded.

15. The mute control circuit of claim 14, wherein the auxiliary circuit further comprises a second diode, an anode of the second diode is electrically connected to the collector of the first transistor, a cathode of the second diode is electrically connected to the base of the second transistor through the fourth resistor.

16. The mute control circuit of claim 15, wherein the first transistor is a PNP type bipolar junction transistor, the second transistor is a NPN type bipolar junction transistor.

* * * * *